(12) United States Patent
Syoujiguchi

(10) Patent No.: US 9,396,834 B2
(45) Date of Patent: Jul. 19, 2016

(54) METAL FOIL PROVIDED WITH FILLER-CONTAINING RESIN LAYER AND METHOD FOR MANUFACTURING METAL FOIL PROVIDED WITH FILLER-CONTAINING RESIN LAYER

(75) Inventor: Takashi Syoujiguchi, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 297 days.

(21) Appl. No.: 13/814,303

(22) PCT Filed: Jul. 29, 2011

(86) PCT No.: PCT/JP2011/067539
§ 371 (c)(1),
(2), (4) Date: Mar. 18, 2013

(87) PCT Pub. No.: WO2012/017967
PCT Pub. Date: Feb. 9, 2012

(65) Prior Publication Data
US 2013/0177739 A1    Jul. 11, 2013

(30) Foreign Application Priority Data
Aug. 6, 2010   (JP) .................. 2010-177120

(51) Int. Cl.
H01B 3/00       (2006.01)
H01B 17/62      (2006.01)
(Continued)

(52) U.S. Cl.
CPC .............. H01B 3/004 (2013.01); H01B 17/62 (2013.01); H05K 1/0373 (2013.01); H05K 1/05 (2013.01);
(Continued)

(58) Field of Classification Search
CPC .......... H01B 3/004; H01B 3/12; H01B 17/62; H01B 3/02; H01B 3/30; H01B 3/40; B05K 1/0373; B32B 15/08; H05K 1/05; H05K 2201/0209; H05K 2201/0154; H05K 2201/0175; H05K 2201/0179; H05K 2201/0191; H05K 3/022; H05K 1/0373; Y10T 428/24372; Y10T 428/24405; Y10T 428/24942
USPC ....................................................... 428/458
See application file for complete search history.

(56) References Cited

U.S. PATENT DOCUMENTS

2007/0098910 A1    5/2007  Yamagata et al.
2007/0207337 A1*   9/2007  Nagatani ............... 428/607
(Continued)

FOREIGN PATENT DOCUMENTS

JP    2007-131946    5/2007
JP    2007-173714    7/2007
(Continued)

OTHER PUBLICATIONS

JP2009113465A_Translation, May 28, 2009.*
(Continued)

*Primary Examiner* — Aaron Austin
*Assistant Examiner* — Jasper Saberi
(74) *Attorney, Agent, or Firm* — Greenblum & Bernstein, P.L.C.

(57) ABSTRACT

A metal foil is provided with a filler-containing resin layer that is thin and has a smooth surface as a metal foil provided with an insulating layer. The filler-containing resin layer having a thickness of 0.1 μm to 3.0 μM, the gloss at the surface of the filler-containing resin layer is 200 or more, and the surface roughness (Ra) measured by an atomic force microscope in a measurement area of 5 μm×5 μM on the filler-containing resin layer is 25 nm or less is stacked on the smooth surface of the metal foil having a gloss exceeding 400 and surface roughness (Ra) measured by an atomic force microscope in a measurement area of 5 μm×5 μm of 10 nm or less.

10 Claims, 6 Drawing Sheets

(51) Int. Cl.
*H05K 1/05* (2006.01)
*H05K 3/02* (2006.01)
*H05K 1/03* (2006.01)

(52) U.S. Cl.
CPC ........ *H05K 3/022* (2013.01); *H05K 2201/0154* (2013.01); *H05K 2201/0209* (2013.01); *H05K 2203/0759* (2013.01); *Y10T 428/24355* (2015.01); *Y10T 428/24372* (2015.01)

(56) References Cited

U.S. PATENT DOCUMENTS

2007/0232734 A1 10/2007 Kanakarajan et al.
2009/0233120 A1* 9/2009 Maruyama et al. ............ 428/612
2010/0273014 A1* 10/2010 Ueki .............................. 428/457

FOREIGN PATENT DOCUMENTS

| JP | 2007-180217 | 7/2007 |
| JP | 2008140786 | 6/2008 |
| JP | 2009-113465 | 5/2009 |
| JP | 2009-532521 | 9/2009 |

OTHER PUBLICATIONS

JP2007173714A_Translation, May 4, 2007.*
Search report from International Application No. PCT/JP2011/067539, mail date is Nov. 1, 2011.

* cited by examiner

METAL FOIL PROVIDED WITH FILLER-CONTAINING RESIN LAYER AND METHOD FOR MANUFACTURING METAL FOIL PROVIDED WITH FILLER-CONTAINING RESIN LAYER

TECHNICAL FIELD

The present invention relates to a metal foil provided with a filler-containing resin layer and a method for manufacturing the metal foil provided with a filler-containing resin layer. In particular, the present invention relates to a metal foil provided with a filler-containing resin layer suitably used as an electronic circuit-forming material for forming various electronic circuits on printed wiring board or semiconductor mounting substrate, or as an electronic device-forming material for forming various electronic devices; and relates to a method for manufacturing the metal foil provided with a filler-containing resin layer.

BACKGROUND ART

A metal foil provided with an insulating layer or a dielectric layer which will be hereinafter simply referred to as "a metal foil provided with an insulating layer" wherein the insulating layer or the dielectric layer which will be hereinafter simply referred to "an insulating layer or the like"; has been used as an electronic circuit-forming material for forming various electronic circuits on printed wiring board or semiconductor mounting substrate, or as an electronic device-forming material for forming various electronic devices.

For example, such a metal foil provided with an insulating layer is manufactured by applying a coating liquid prepared by mixing a ceramic particle (insulating filler) and a resin composition on the surface of a metal foil, followed by curing the resin composition by means including drying and heat treatment. The insulating layer or the like composed of an inorganic material and an organic material formed by the method is popularly referred to as a composite type material.

Note that in such a metal foil provided with an insulating layer used as an electronic circuit-forming material or an electronic device-forming material being thin and having a smooth surface on the insulating layer has been required. However, when a composite-type insulating layer is provided as a thin layer, insulating filler particles may project not uniformly from the surface of the insulating layer and it makes the surface of the insulating layer rough.

For example, Patent Document 1 discloses a technology to make the surface of the insulating layer smooth in which the surface of the insulating layer is pressed with a surface smoothing unit called "a mold" after the coated film is applied on the surface of a base material to make ceramic particles projecting from the coated film get back inside of the coated film, and thus the surface of the finished insulating layer is made smooth. In the present application, the words "coated film" is a film formed on the surface of a base material (inclusive of a metal foil) by applying a coating liquid on the surface of the base material. Next, by drying the coated film followed by semi-curing or full-curing the dried coated film through heat treatment, the insulating layer is finished.

DOCUMENTS CITED

Patent Document

[Patent Document 1] Japanese Patent Laid-Open No. 2008-140786

SUMMARY OF INVENTION

Problems to be Solved

However, according to the method described in the Patent Document 1, a mold having the same area as the surface area of the insulating layer should be prepared and the surface of the insulating layer should be pressed uniformly to obtain an insulating layer having a smooth surface. So, the size of the insulating layer able to be formed on a metal foil has been limited because the size of the mold able to uniformly press the surface of the insulating layer is limited.

According to descriptions above, an object of the present invention is set to provide a metal foil provided with a filler-containing resin layer being thin and having a smooth surface as a metal foil provided with an insulating layer, and to provide a method for manufacturing a metal foil provided with a filler-containing resin layer which is excellent in reproducibility and enables manufacturing of such a metal foil provided with a filler-containing resin layer in a wide area.

Means to Solve the Problem

Then, as a result of a diligent study of the present inventor, the metal foil provided with a filler-containing resin layer being thin and having a smooth surface; and a method for manufacturing a metal foil provided with a filler-containing resin layer which enables manufacturing of such a metal foil provided with a filler-containing resin layer excellent in reproducibility in a wide area described later were thought out and the object was achieved.

The metal foil provided with a filler-containing resin layer according to the present invention is a metal foil provided with a filler-containing resin layer in which a metal foil and a filler-containing resin layer composed of insulating filler and a binder resin are stacked, wherein: the metal foil has smooth surface of which gloss exceeds 400 and surface roughness (Ra) measured by an atomic force microscope in a measurement area of 5 µm×5 µm is 10 nm or less; and the filler-containing resin layer applied on the smooth surface has a thickness of 0.1 µm to 3.0 µm, the gloss at the surface of the filler-containing resin layer is 200 or more, and the surface roughness (Ra) measured by an atomic force microscope in a measurement area of 5 µm×5 µm on the filler-containing resin layer is 25 nm or less.

The method for manufacturing a metal foil provided with a filler-containing resin layer according to the present invention is a method for manufacturing the metal foil provided with a filler-containing resin layer, comprising: a coating liquid preparation step for preparation of a coating liquid including insulating filler dispersed in a varnish including a binder resin composition and a solvent; a coating step for forming a coated film by applying the coating liquid prepared in the coating liquid preparation step on a smooth surface of the metal foil; a drying step for removing a volatile component in the coated film after finishing the coating step; and a heat treatment step for finishing the filler-containing resin layer by applying heat treatment on the coated film after finishing the drying step.

Advantages of the Invention

As for the metal foil provided with a filler-containing resin layer according to the present invention, as the filler-containing resin layer comprises insulating filler and a binder resin, the filler-containing resin layer is used as an insulating layer or a dielectric layer by utilizing the insulating property or the dielectric property when various electronic circuits or various electronic devices are manufactured. Note that, the filler-containing resin layer is applied on the smooth surface of the metal foil. The smooth surface of the metal foil has a gloss exceeding 400, and surface roughness (Ra) measured by an atomic force microscope in a measurement area of 5 µm×5 µm of 10 nm or less, i.e. excellent in smoothness. So, influence of the roughness at the coating side of the metal foil on the filler-containing resin layer is prevented even when an extremely thin filler-containing resin layer having a thickness of 0.1 µm to 3 µm is provided on the smooth surface. Thus, an extremely excellent smooth insulating layer or a dielectric layer in which the gloss at the surface of the filler-containing resin layer is 200 or more and the surface roughness (Ra) measured by an atomic force microscope in a measurement area of 5 µm×5 µm on the filler-containing resin layer is 25 nm or less is provided. As described above, as the surface of the filler-containing resin layer to be used as an insulating layer or a dielectric layer is smooth, leak of electric current is reduced, and when various electronic circuits or various electronic devices are manufactured, reliability in the operation stability of the electronic circuits or the electronic devices are improved. That is, with the metal foil provided with a filler-containing resin layer according to the present invention, a metal foil provided with an insulating layer being thin and having a smooth surface is provided.

Next, with the method for manufacturing a metal foil provided with a filler-containing resin layer according to the present invention, an insulating layer being thin and having a smooth surface in which insulating filler is extremely homogenously dispersed is formed. Also, such an insulating layer on the surface of a metal foil in a wide area is formed in the manufacturing with excellent reproducibility.

PREFERRED EMBODIMENT OF THE INVENTION

Figure 1:
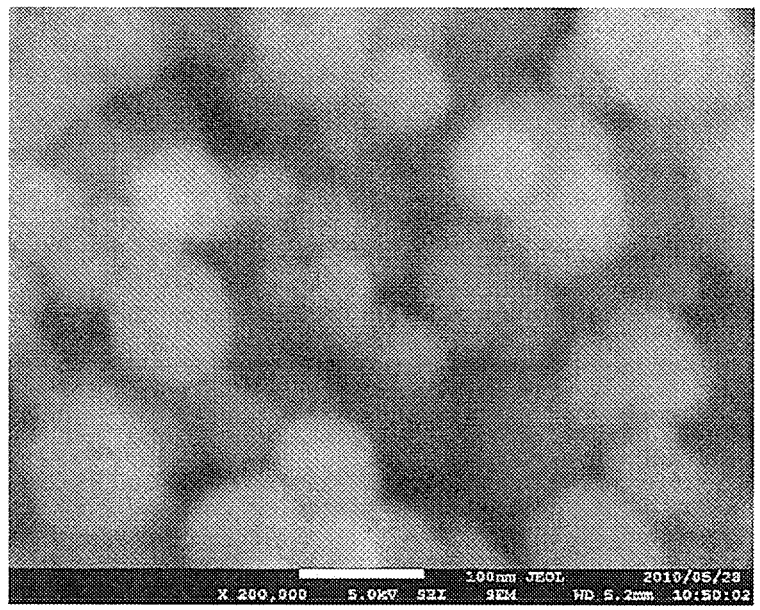
FIG. 1 is a SEM image of insulating filler with magnification of 200,000 times, and is a figure to demonstrate a measurement method of the average particle size ($D_{IA}$) of insulating filler. The average particle size ($D_{IA}$) determined in the SEM image is about 68 nm, and the coefficient of variation (CV) is 32%.

The preferred embodiments of the metal foil provided with a filler-containing resin layer and the method for manufacturing a metal foil provided with a filler-containing resin layer according to the present invention will be described. The metal foil provided with a filler-containing resin layer according to the present invention is preferably used as the materials such as electronic circuit-forming materials for forming various electronic circuits including capacitor circuits and transistor circuits having laminate structures composed of conductive layers and insulating layers in a printed wiring boards or semiconductor substrates, or electronic device-forming materials for forming various electronic devices having laminate structures composed of conductive layers and insulating layers including capacitors and transistors. Then, the metal foil provided with a filler-containing resin layer will be described first, and then the method for manufacturing the metal foil provided with a filler-containing resin layer will be described.

1. Metal Foil Provided with Filler-Containing Resin Layer

The metal foil provided with a filler-containing resin layer according to the present invention is a laminate composed of a metal foil and a filler-containing resin layer comprising insulating filler and a binder resin. First, the metal foil will be described.

<Metal Foil>

The metal foil according to the present invention is, for example, a layer used as a conductive layer, an electrode layer and the like in electronic circuits or electronic devices. As such a metal foil, metal foils manufactured by rolling method or electrodeposition method are used. The metal foil including copper foil, nickel foil, copper alloy foil (such as brass foil or Corson alloy foil) or nickel alloy foil (such as nickel-phosphorus alloy foil or a nickel-cobalt alloy foil) may be used. However, when the matter that formation of electronic circuits or the like using the metal foil provided with a filler-containing resin layer is performed by etching method or the like is considered, it is preferable to use a metal foil having a homogenous composition from the viewpoint of well forming of fine patterns such as fine conductive patterns or fine electrode patterns. Also, when the metal foil is used as a conductive layer, the metal foil is preferably composed of copper or a copper alloy being lower in electrical resistivity as compared to nickel and being a nonmagnetic material. Further, copper foil is more easily available as compared to nickel foil or the like. As the copper foil is easy for processing such as etching and inexpensive, employing of copper foil as the metal foil has an advantage in both excellent workability and production cost reduction.

Smooth Surface: The metal foil is preferable to have smooth surface in which gloss exceeds 400 and surface roughness (Ra) measured by an atomic force microscope in a measurement area of 5 μm×5 μm is 10 nm or less. Thickness of the filler-containing resin layer is made uniform by providing a filler-containing resin layer being extremely thin as 0.1 μm to 3.0 μm on the smooth surface of such an extremely smooth metal foil. Then, influence of the surface roughness of the metal foil is prevented from affecting on the surface of the filler-containing resin layer.

Note that gloss described above is the specular gloss employing Gs (60° where light for measurement incidents on the smooth surface of the metal foil as a specimen at angle of 60° and intensity of reflected light at a reflection angle of 60° is measured. The measurement of the gloss was carried out according to JIS Z 8741-1997 and was performed by using the gloss-meter VG-2000 manufactured by Nippon Denshoku Industries Co., Ltd. Next, the surface roughness is the arithmetic mean roughness (Ra) measured by an atomic force microscope in a measurement area of 5 μm×5 μm. Note that, the surface roughness is a value obtained in the surface roughness measurement using the atomic force microscope "NanoscopeV for Dimension series" supplied by Veeco Japan Co., Ltd. with the tapping mode without flattening correction.

Generally speaking, there is a certain correlation between the gloss and the smoothness at the surface of a metal foil, and in many cases, the higher the gloss, the more excellent the smoothness of the metal foil. When the value of the surface roughness (Ra) is 10 nm or less, the gloss is about 300 or more in many cases. It can also be said that the higher the gloss, the smaller the waviness at the surface and the roughness at the surface is uniform. Consequently, the above-described advantageous effects are obtained by using a metal foil having a smooth surface in which gloss and surface roughness (Ra) are in the specific ranges respectively. On the other hand, when either one of the gloss and the surface roughness is out of the specific range, the surface roughness of the metal foil affects on the surface of the filler-containing resin layer and is not preferable. Further, the layer thickness of the filler-containing resin layer is made nonuniform because an extremely thin filler-containing resin layer is provided on the surface of the metal foil.

<Filler-Containing Resin Layer>

Next, the filler-containing resin layer will be described. In the present invention, the filler-containing resin layer is provided on the smooth surface of the metal foil. The filler-containing resin layer includes insulating filler and a binder resin. Insulating filler and the binder resin are both insulating materials, and the filler-containing resin layer is a layer used as various insulating layers such as gate insulating layers in transistor circuits or dielectric layers such as capacitor circuits by utilizing its insulating property or the dielectric property. When the filler-containing resin layer is provided on the smooth surface of the metal foil, thickness of the filler-containing resin layer is prevented from being nonuniform due to the surface roughness of the metal foil, or the surface of the filler-containing resin layer is prevented from being rough due to the surface roughness of the metal foil.

Layer Thickness: In the present invention, the filler-containing resin layer is characterized in that thickness is 0.1 μm to 3.0 μm. Because the layer thickness is as thin as 0.1 μm to 3.0 μm and the formation of fine wiring patterns and the like is excellent as described above in the metal foil provided with filler-containing resin layer according to the present invention, the downsizing in various electronic circuits or various electronic devices is achieved.

Surface Smoothness: The filler-containing resin layer according to the present invention is characterized in that the gloss at the surface is 200 or more and the surface roughness (Ra) measured by an atomic force microscope in a measurement area of 5 μm×5 μm is 25 nm or less. Such an excellent surface smoothness reduces the generation of leak of electric current and achieves high reliability in electronic circuits or electronic devices manufactured. Such an excellent surface smoothness is achieved by the matter that insulating fillers do not non-uniformly protrude on the surface of the filler-containing resin layer, i.e. insulating fillers are homogeneously dispersed in the filler-containing resin layer. So, the filler-containing resin layer according to the present invention is homogenous in dispersion of insulating filler in the binder resin to make insulating property or dielectric property uniform.

The gloss at the surface of the filler-containing resin layer is measured by the same method as in the measurement of gloss at the surface of the metal foil. Also, the surface roughness at the surface of the filler-containing resin layer is measured by the same method as in the measurement of the surface roughness of the metal foil. The relationship between the gloss and the surface roughness is as described above. When the gloss at the surface is less than 200, even when the surface roughness (Ra) measured by an atomic force microscope is 25 nm or less, the surface of the filler-containing resin layer may be rough at some portion, and the aiming effect may not be achieved. Even when the gloss at the surface of the filler-containing resin layer is 200 or more and the surface roughness is uniform and the gloss at the surface is uniform, when the surface roughness (Ra) does not satisfy the specific range, the aiming effect will not be achieved because the surface roughness (Ra) at the surface of the filler-containing resin layer exceeds 25 nm.

Binder Resin: Next, binder resin will be described. As for the binder resin according to the present invention, the resin materials used for forming the insulating base materials for electronic circuit materials or the insulating layers of the printed wiring boards are preferably used. For example, the resins including polyimide resin, epoxy resin, poly-vinylidene fluoride, cyanoethyl purulane, benzocyclobutene, polynorbornene, polytetrafluoroethylene and acrylate can be used. The above-listed resins may be used each alone or as mixtures of two or more. In the present invention, epoxy resin and polyimide resin is preferable to be used among the resins listed above as the binder resin. This is because epoxy resin and polyimide resin are both widely used as materials for forming insulating layers, and are excellent in reliability of the insulating property.

In the present invention, both epoxy resin and polyimide resin can be used as the binder resin. However, it is preferable to use polyimide resin. This is because polyimide resin is superior in both heat resistance and insulating property to epoxy resin. In practice, the decomposition temperature of epoxy resin is about 250° C. and the decomposition temperature of polyimide resin is about 450° C. in general, i.e. polyimide resin is superior in heat resistance to epoxy resin. Next, the volume resistivity of epoxy resin is $1.0 \times 10^{14}$ Ω·cm and the dielectric breakdown voltage of epoxy resin is approximately 40 kV/mm. In contrast, the volume resistivity of polyimide resin is $1.5 \times 10^{16}$ Ω·cm and the dielectric breakdown voltage of polyimide resin is approximately 150 kV/mm, i.e. polyimide resin is superior in insulating property to epoxy resin. So, a filler-containing resin layer more excellent in both heat resistance and insulating property can be obtained when polyimide resin is used.

Insulating filler: Next, insulating filler will be described. Insulating filler is dispersed in the filler-containing resin layer as an insulating layer, and is a component used for improvement of the insulating property or the dielectric property of the filler-containing resin layer. As insulating filler, inorganic oxide particles are preferably used. According to the usage of the filler-containing resin layer, inorganic oxide particles such as an alumina particle, a zirconia particle and a titanate particle are selectively used. When dielectric property should be improved in the filler-containing resin layer, it is preferable to use a perovskite-type dielectric particle as an inorganic oxide particle. As the perovskite-type dielectric particle, dielectric particles having the elemental compositions common in barium titanate, strontium titanate, barium strontium titanate, strontium zirconate and bismuth zirconate are exemplified. Among substances, it is preferable to use the dielectric particle having the elemental composition any of barium titanate, strontium titanate and barium strontium titanate. This is because titanate is ferroelectric material, and by using the dielectric particle having any of the compositions of titanate as insulating filler, the filler-containing resin layer can be used as a dielectric layer having a high relative dielectric constant. Then, the filler-containing resin layer is preferably used as the dielectric layers in capacitor circuits for example. That is, when a metal foil is used as a bottom electrode layer for example and a top electrode layer or a top electrode pattern is formed on the surface of the filler-containing resin layer, the filler-containing resin layer is preferably used as the dielectric layer of a capacitor circuit.

Particle Size: The average particle size ($D_{IA}$) of insulating filler is preferable to be 5 nm to 150 nm and more preferably 20 nm to 100 nm. In the present invention, as fine insulating filler particle having an extremely small particle size is used, individual particles are in a certain secondary agglomerating state. So, an indirect measurement estimating the average particle size from the measured values including a laser diffraction-scattering particle size distribution measurement method cannot accurately measure the particle size of insulating filler. Then, in the present invention, insulating filler is directly observed with a scanning electron microscope (SEM) and the resulting average secondary particle size of the secondary particles obtained by image analysis on the SEM image is used as an index.

In the present invention, insulating filler is dispersed homogenously in the coating liquid in the coating liquid preparation step where insulating filler deagglomerates because the fine insulating filler particle having average particle size ($D_{IA}$) of 5 nm to 150 nm is used. So, both the gloss and the surface roughness at the surface of the filler-containing resin layer satisfy the specific ranges because insulating filler is homogeneously dispersed in a state close to finer primary particles in a filler-containing resin layer being extremely thin as 0.1 μm to 3 μm. Because insulating filler is homogeneously dispersed in such an extremely thin filler-containing resin layer, an insulating layer or a dielectric layer both uniform in insulating property or dielectric property and free from in plane deviation can be formed. Further, as fine insulating filler particles having particle sizes in the specific range is used, the smoothness is maintained at the surface, the packing ratio of insulating filler in the filler-containing resin layer increases in addition, and an insulating layer having high insulating property is provided.

Note that, the average particle size ($D_{IA}$) of insulating filler is the value obtained by image analysis of the SEM image as described above. In practice, the value is determined by the following procedure.

First, SEM (JSM-700IF) manufactured by JEOL Ltd. is used, the specimen (insulating filler) is imaged with magnification of 200,000 times, and thus a SEM image was obtained. In the imaging procedure, the position of the imaging object in the specimen is optional. The positions of the imaging object are changed, and imaging on the specimen is carried out a plurality of times, and thus obtain plurality of SEM images different in the positions of the imaging object. Then, from the plurality of SEM images, one sheet of image which is less in overlap of insulating filler particles to make discernment of outer shape of insulating filler particles in an agglomerating state easy (see FIG. 1) is selected. Then, from insulating filler particles present in the field of vision of the selected SEM image, all insulating filler particles easy in discernment of outer shape from other insulating filler particles are selected, and the outer shape of each of the selected insulating filler particles is encircled with an ellipse, and the major axis of the ellipse is measured as the particle size (secondary particle size) of insulating filler particle. The resulting average value of thus measured particle sizes of the individual insulating filler particles is taken as the average particle size ($D_{IA}$).

Note that the average particle size ($D_{IA}$) can also be determined by image processing. In practice, determination of the average particle size ($D_{IA}$) by using IP-1000PC manufactured by Asahi Engineering Corp. can be exemplified in which a SEM image obtained by the same procedure as described above is subjected to a circular particle analysis with a circularity threshold set at 10 and an overlap degree set at 20.

Particle size deviation: In the present invention, smaller particle size deviation in insulating filler is better from the viewpoint of forming a filler-containing resin layer excellent in gloss and smoother at the surface. For example, it is preferable to use insulating filler which has coefficient of variation (CV) value represented by the following expression of 40% or less when the standard deviation (S.D.) and the average particle size ($D_{IA}$) are determined according to the method described above, the particle sizes of all insulating filler particles present in the field of vision of the SEM image are measured:

$$\text{CV (\%)} = \text{standard deviation (S.D.)/average particle size } (D_{IA}) \times 100 \quad \text{(Expression)}$$

When insulating filler having a narrow particle size distribution of which coefficient of variation (CV) represented by the expression is 40% or less is used, the dispersion of insulating filler in the coating liquid is made homogenous. Consequently, packing ratio of insulating filler in the filler-containing resin layer is improved, and the smoothness at the surface of the filler-containing resin layer is further improved.

Packing Ratio of Insulating filler: In the filler-containing resin layer, it is preferable to contain insulating filler from 50% by weight to 90% by weight in relation to the sum amount of insulating filler and the binder resin set at 100% by weight. When content of insulating filler is 50% by weight to 90% by weight in the filler-containing resin layer in relation to the sum amount of insulating filler and the binder resin set at 100% by weight, a filler-containing resin layer excellent in the packing ratio of insulating filler and excellent in the insulating property or the dielectric property is obtained. On the contrary, when the content of insulating filler is less than 50% by weight, even when the layer of the filler-containing resin layer is made thick, the packing ratio of insulating filler is low and it is difficult to achieve the dielectric property of demand level in the market. When the content of insulating filler exceeds 90% by weight, the content of the binder resin less than 10% by weight may make the adhesion between insulating filler resin layer and the metal foil poor and is not preferable.

Figure 2:
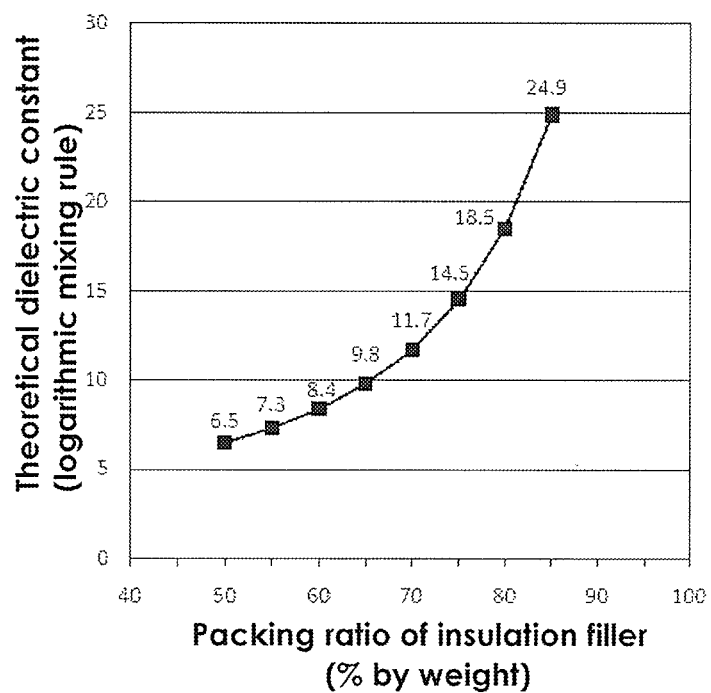
FIG. 2 is a graph demonstrating the theoretical dielectric constant as a function of the content (packing ratio) of insulating filler in relation to the sum amount of insulating filler and the binder resin set at 100% by weight.

The theoretical dielectric constant as a function of the content (packing ratio) of insulating filler in relation to the sum amount of insulating filler and the binder resin set at 100% by weight is shown in FIG. 2. In practice, FIG. 2 shows theoretical dielectric constant of the filler-containing resin layer based on the logarithmic mixing rule when the $BaTiO_3$ is used as insulating filler and polyimide resin is used as the binder resin composition. Note that, relative dielectric constant of polyimide resin is 3.2 and relative dielectric constant of $BaTiO_3$ is 100. In addition, density of polyimide resin is 1.43 $g/cm^3$ and density of $BaTiO_3$ is 5.5 $g/cm^3$. As apparent in FIG. 2, the theoretical dielectric constant of the filler-containing resin layer based on the logarithmic mixing rule is 6.5 when the content of insulating filler is 50% by weight. The theoretical dielectric constant is 35.7 when the content of insulating filler is 90% by weight. As apparent in FIG. 2, $BaTiO_3$, a ferroelectric, is extremely high in relative dielectric constant as compared to polyimide resin, the binder resin composition. The theoretical dielectric constant of the filler-containing resin layer increases with content of $BaTiO_3$ increase as a matter of course. In particular, the theoretical dielectric constant of the filler-containing resin layer is 11.7 when the content of insulating filler exceeds 70% by weight. So, when excellent dielectric property should be provided in the filler-containing resin layer, the higher the content of insulating filler is more preferable from the viewpoint of increasing relative dielectric constant. Then, the content of insulating filler of 70% by weight or more is preferable, for example.

2. Method for Manufacturing Metal Foil Provided with Filler-Containing Resin Layer Next, method for manufacturing the metal foil provided with a filler-containing resin layer according to the present invention will be described. The method for manufacturing the metal foil provided with a filler-containing resin layer according to the present invention is a method for manufacturing the above-described metal foil provided with a filler-containing resin layer according to the present invention, and includes 2-1; a coating liquid preparation step, 2-2; a coating step, 2-3; a drying step and 2-4; a heat treatment step. Hereinafter, these steps will be described one by one.

2-1 Coating Liquid Preparation Step

The coating liquid preparation step according to the present invention is a step to prepare a coating liquid in which insulating filler is dispersed in a varnish comprising a binder resin composition and a solvent. First, the varnish and the coating liquid will be described, and then, the viscosity and the like of the coating liquid, the concentrations of the individual constituent in the coating liquid will be described.

<Varnish>

First, the preparation of the varnish will be described. In the present invention, the solution including the binder resin composition and the solvent before mixing of insulating filler is referred to as the varnish.

Binder Resin composition: Note that, the binder resin composition is the precursor of the binder resin. The precursor of the binder resin is, for example, a material such as a monomer, an oligomer or a prepolymer before condensation polymerization or cross-linking which forms the aiming binder resin by a reaction such as condensation polymerization or cross-linking reaction. As for the binder resin composition, components such as a polymerization initiator, a cross-linking agent and a curing agent can be included according to the need. In the present invention, polyamic acid, a precursor of polyimide resin, is used as the binder resin composition, for example, when polyimide resin is used as the binder resin among the above-listed resins in the coating liquid preparation step. When epoxy resin is used as the binder resin, the binder resin composition includes an epoxy resin before cross-linking and a cross-linking agent or a curing agent.

Solvent: As the solvent, an organic solvent which can dissolve the binder resin composition will be selected. It is preferable to use a highly volatile organic solvent in consideration of removal by evaporation of the solvent to a specific amount in the following drying step. It is preferable to appropriately select a suitable solvent depending on the type of the binder resin composition. For example, when polyimide resin is used as the binder resin, solvents which can dissolve polyamic acid, a precursor of polyimide resin, or the monomers for obtaining polyamic acid, biphenyl tetracarboxylic acid dianhydride and paraphenylenediamine will be selected. In practice, N-methyl-2-pyrrolidone can be used. Next, when epoxy resin is used as the binder resin, methyl ethyl ketone, cyclopentanone, or mixed solvents composed of these can be used as the solvent for example. Note that, the solvents described-above are not intended to limit the solvent; other solvents can also be appropriately used as long as solvents can dissolve the binder resin composition and are highly volatile.

The varnish described above may be prepared by mixing a solvent and a binder resin composition by oneself, or commercially available raw varnishes including the components in predetermined concentrations may also be used. When a commercially available raw varnish is used, the raw varnish may be appropriately diluted with a solvent to adjust in a preferable concentration range. The preferable concentration range of the binder resin composition in the preparation of the varnish will be described later.

<Coating Liquid>

Next, coating liquid will be described. The coating liquid according to the present invention is prepared by mixing insulating filler to the varnish prepared as described above, and insulating filler is dispersed in the varnish. In this case, to disperse insulating filler homogenous, a dispersant including a surfactant may be appropriately added. According to the reasons described above, insulating filler having an average particle size ($D_{IA}$) of the secondary particles in an agglomerating state of 5 nm to 150 nm can be used, and it is more preferable to use insulating filler having an average particle size ($D_{IA}$) of 20 nm to 100 nm. Next, it is preferable to use insulating filler having a deviation in particle size distribution represented by the coefficient of variation (CV) of 40% or less. Here, the description on insulating filler itself is omitted because such a description is duplicated with the descriptions above.

<Concentrations of Various Components in Coating Liquid>

Viscosity of Coating Liquid: Next, the concentrations of the various components in preparation of the coating liquid will be described. In the coating liquid preparation according to the present invention, the concentrations of the various components in the coating liquid are adjusted to make the viscosity of the coating liquid 300 mPa·s or less. This is because the coating liquid should be uniformly applied on the smooth surface of the metal foil and a coated film having smooth surface is formed by adjusting the viscosity of the coating liquid to be 300 mPa·s or less which assures easy coating ability of the coating liquid. Consequently, the gloss and the surface roughness at the surface of the filler-containing resin layer obtained after finishing the drying step and the heat treatment step is adjusted in the specific ranges. Further, it is preferable to adjust the viscosity of the coating liquid to be 100 mPa·s or less. This is because when the viscosity of the coating liquid is 100 mPa·s or less, the easy coating ability of the coating liquid is further assured and it is made easier to form a coated film having a uniform thickness and a smooth surface. Note that the viscosity is a value measured at 25° C.±5° C. by the tuning-fork vibration method. The tuning-fork vibration viscometer SV-10 manufactured by A&D Co., Ltd may be used in the viscosity measurement for example.

Mixing Ratio between Insulating Filler and Binder Resin Composition: The mixing ratio between insulating filler and the binder resin composition is determined to contain insulating filler from 50% by weight to 90% by weight in relation to the total solid content, sum of insulating filler content and the binder resin content (resin solid content) originated from the binder resin composition included in the coating liquid, set at 100% by weight when the coating liquid is prepared in the present invention. Note that, the resin solid content is the weight of the binder resin obtained from the binder resin composition included in the varnish. When the mixing ratio between insulating filler and the binder resin composition in the coating liquid satisfies the specific range, the packing ratio of insulating filler in the finished filler-containing resin layer satisfies the preferable range described above. In the present invention, the mixing amount of insulating filler is determined depending on the concentration of the binder resin in the varnish because the varnish is prepared and then insulating filler is mixed.

Concentration of Binder Resin Composition in Varnish: The viscosity of the coating liquid changes depending on the concentration of the binder resin in the varnish. Note that, the concentration of the binder resin in the present invention is the concentration of the binder resin in terms of the amount of the binder resin obtained from the binder resin composition included in the varnish. In other words, the concentration of the binder resin here is the so-called concentration of the resin solid content. In the present invention, the concentration of the binder resin in the varnish is determined to adjust the viscosity of the coating liquid to be 300 mPa·s or less and preferably 100 mPa·s or less. Note that the lower the concentration of the binder resin (concentration of the resin solid content) in the varnish, the lower the viscosity of the coating liquid. So, when only the easy coating ability is considered, the lower the concentration of the binder resin in the varnish is more preferable. However, when the concentration of the binder resin in the varnish is low, fine pores (voids) may sometimes generate in the coated film when the coated film is dried, or the volume contraction of the coated film at the time of drying is made large because amount of the solvent (volatile component amount) evaporates in the drying step is large. Consequently, the surface of the coated film is made rough in the drying step, and the surface of the finished filler-containing resin layer may be also rough. So, from the viewpoint to inhibit voids generation and volume contraction in the coated film in the drying step, it is preferable to increase the concentration of the binder resin to be as high as possible in consideration of the viscosity of the coating liquid to reduce amount of the volatile component evaporates. In the varnish preparation, it is necessary to determine the concentration of the binder resin to adjust the viscosity of the coating liquid 300 mPa·s or less; however, the viscosity of the varnish itself may exceed 300 mPa·s.

Concentration of the Total Solid Content: From the same viewpoint as for the concentration of the binder resin in the varnish, it is preferable to adjust the concentration of the total solid content in the coating liquid as the sum content of insulating filler and the binder resin obtained from the binder resin composition as high as possible within the range where the viscosity of the coating liquid is adjusted to be 300 mPa·s or less and preferably 100 mPa·s or less. This is because when the concentration of solid content in the coating liquid is adjusted higher, the amount of the solvent as a volatile component is reduced and generation of voids in the coated film caused by evaporation of the volatile component in the drying step is prevented and a filler-containing resin layer having a uniform thickness and a smooth surface can be manufactured.

Figure 3:
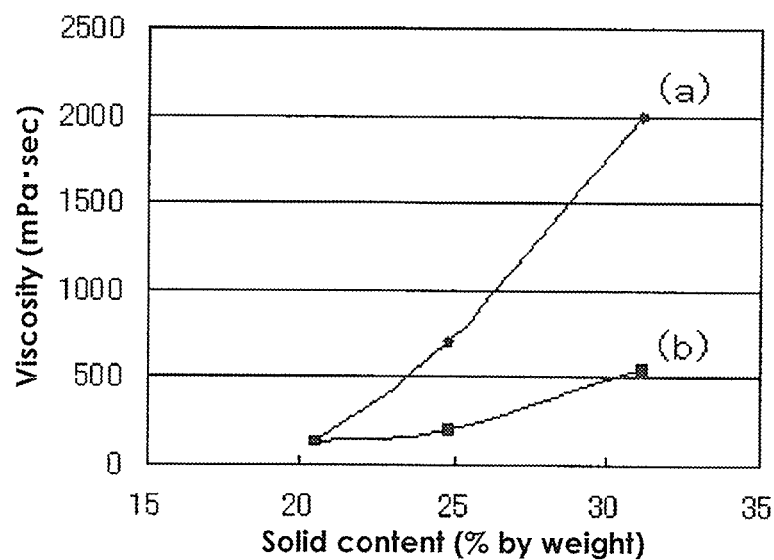
FIG. 3 is a graph demonstrating the viscosities of the coating liquid before and after dispersing insulating filler. The coating liquid used in FIG. 3 is the same as the coating liquid prepared in Example 1; and Line (a) demonstrates the viscosities of the coating liquid before homogeneously dispersing insulating filler, and Line (b) demonstrates the viscosities of the coating liquid after homogeneously dispersing insulating filler.

When the concentration of the total solid content is determined, it is preferable to adjust the concentration of the total solid content as high as possible in consideration of the decrease of the viscosity in the coating liquid due to the dispersion of insulating filler. This is because even when the viscosity of the coating liquid just after the mixing of insulating filler exceeds 300 mPa·s, the viscosity of the coating liquid will decrease as insulating filler disperse. For example, line (a) in FIG. 3 shows the viscosity of the coating liquid before homogeneously dispersing insulating filler; and line (b) shows the viscosity of the coating liquid after homogeneously dispersing insulating filler. The coating liquid used for the measurement in FIG. 3 was composed of polyimide resin as the binder resin and N-methyl-2-pyrrolidone as the solvent. Next, a BST particle having an average particle size ($D_{IA}$) of about 68 nm was used as insulating filler, and no dispersant was added. Insulating filler was dispersed for 1 hour with fine media made of zirconia having a bead diameter of 0.3 mm, followed by 1 hour dispersing with the fine media made of zirconia having a bead diameter of 0.1 mm by using Picomill disperser (wet pulverizer/disperser).

As apparent in lines (a) and (b) in FIG. 3, even when the concentration of solid contents in the coating liquid are the same, the homogeneous dispersion of insulating filler decreases the viscosity of the coating liquid. That is, even when the viscosity of the varnish exceeds 300 mPa·s, appropriate dispersion of insulating filler will reduce the viscosity of the coating liquid to be 300 mPa·s or less as described above. So, it is preferable to determine the concentration of solid content in the coating liquid in consideration of the fact that the viscosity of the coating liquid decreases by homogeneously dispersing insulating filler.

Concentration of Insulating Filler: The concentration of insulating filler in the coating liquid is also preferable as high as possible as long as the viscosity of the coating liquid is adjusted in the specific range. When the concentration of insulating filler is adjusted high, the packing ratio of insulating filler in the finished filler-containing resin layer is adjusted high, and then the insulating property or the dielectric property of the filler-containing resin layer is improved as described above.

Figure 4:
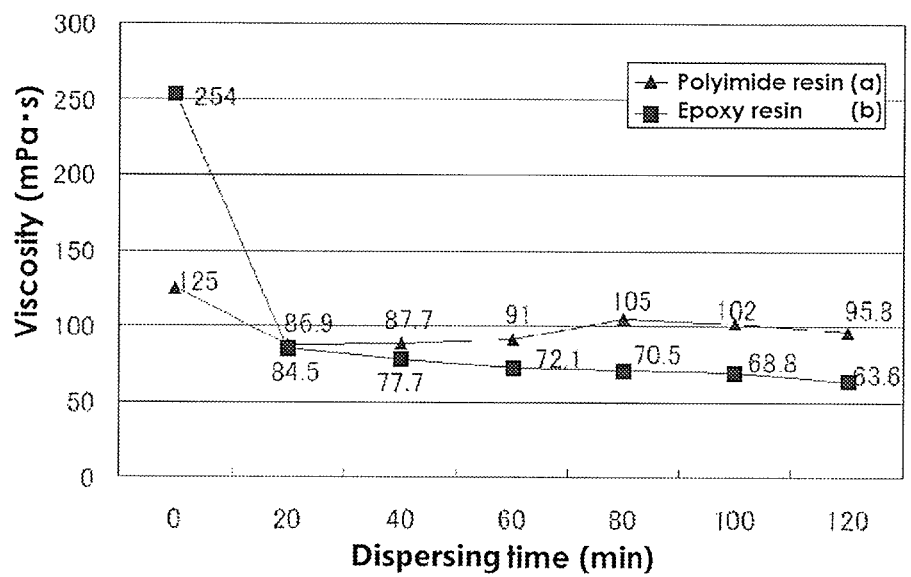
FIG. 4 is a graph demonstrating the dispersion property of insulating filler. The coating liquid is the same as the coating liquid prepared in Example 1 and the binder resin is polyimide resin in line (a), and line (b) shows the dispersion property of insulating filler in the coating liquid using epoxy resin as the binder resin.

Dispersion Property of Insulating Filler: FIG. 4 shows the dispersion property of insulating filler. Lines (a) and (b) in FIG. 4 show the viscosity change in the coating liquid as a function of dispersing time. Line (a) shows the viscosity change of the coating liquid where polyimide resin is used as the binder resin; and Line (b) shows the viscosity change of the coating liquid where epoxy resin is used as the binder resin. The coating liquid used in Line (a) was prepared without adding a dispersant, and the coating liquid used in Line (b) was prepared by adding a dispersant.

As apparent in lines (a) and (b) in FIG. 4, even when either of polyimide resin and epoxy resin is used as the binder resin, an appropriate dispersion of insulating filler decreases the viscosity of the coating liquid. However, as apparent in a comparison between lines (a) and (b) in FIG. 4, the degree of the viscosity decreasing in the coating liquid caused by homogeneously dispersing insulating filler is larger in the epoxy resin as compared to the polyimide resin. In this way, difference in viscosity decreasing of the coating resins between the start of the preparation of the coating liquid, the viscosity of the coating liquid before homogeneous dispersion of insulating filler, and after the homogeneous dispersion of insulating filler depends on the type of the resin used as the binder resin. So, it is preferable to adjust each of the concentrations to be appropriate depending on the type of the resin used as the binder resin, the concentration of the binder resin in the varnish, the concentration of solid content in the coating liquid and the concentration of insulating filler in the coating liquid. When an appropriate dispersant is available at the time of preparation of the coating liquid, it is preferable to add the dispersant. For an epoxy resin, for example, BYK-111 manufactured by BYK-Chemie GmbH can be used as a dispersant. The dispersant added in an amount of about 2 mg per 1 $m^2$ of the surface area of insulating filler remarkably affects on the dispersion state of insulating filler and the viscosity of the coating liquid decreases. So, when an appropriate dispersant is used, the viscosity of the coating liquid is adjusted in the specific range, and at the same time, the concentration of the binder resin in the varnish can be adjusted higher as compared to the case where no dispersant is used, and the concentration of solid content and the concentration of insulating filler in the coating liquid can be adjusted higher.

Next, epoxy resin will be exemplified as a typical specific example of the binder resin which keeps low viscosity in the coating liquid according to the factors including the viscosity of the resin and added dispersant even when the concentration of solid content is adjust at a comparatively higher concentration, and preferable ranges of the concentration of solid content, the concentration of insulating filler in the coating liquid and preferable range of the concentration of the binder resin in the varnish will be demonstrated. On the contrary, polyimide resin will be exemplified as a typical specific example of the binder resin hardly achieves so high reduction effect of the viscosity as epoxy resin when insulating filler is homogeneously dispersed, and the preferable ranges of the specific concentrations will be exemplified.

Polyimide Resin: First, polyimide resin will be described. When polyimide resin is used as the binder resin, the concentration of the total solid content in the coating liquid is preferably 20.5% by weight to 55.5% by weight and more preferably 20.5% by weight to 33.1% by weight. The concentration of insulating filler in the coating liquid is preferably 14.4% by weight to 44.4% by weight and more preferably 14.4% by weight to 26.5% by weight. The concentration of the binder resin in the varnish is preferably 7.2% by weight to 20% by weight and more preferably 7.2% by weight to 9% by weight. By adjusting these concentrations in the specific ranges, the viscosity of the coating liquid is adjusted to be 300 mPa·s or less. As apparent in line (a) in FIG. 3 and line (a) in FIG. 4, viscosity of the coating liquid decreases to 100 mPa·s or less by adjusting the dispersing time. By adjusting these concentrations in the specific ranges, a filler-containing resin layer having a uniform thickness and a smooth surface is provided. Also, by adjusting the concentrations of the individual components in preferable ranges respectively, a filler-containing resin layer having more uniform thickness and a smoother surface is formed with excellent reproducibility. Further, the deviation in the properties of the finished filler-containing resin layer including the insulating property and the dielectric property can also be reduced. By the way, suitable dispersant which can make the dispersion state of insulating filler homogenous and suitable for reducing the viscosity of the coating liquid has not been discovered up to now. However, if such a dispersant is discovered, the concentrations of both the total solid content and insulating filler in the coating liquid and the concentration of the binder resin in the varnish will be adjusted higher than the specific ranges described above.

Epoxy Resin: When epoxy resin is used as the binder resin, the concentration of the total solid content in the coating liquid is preferably 60% by weight to 90% by weight and more preferably 70% by weight to 80% by weight. The concentration of insulating filler in the coating liquid is preferably 48% by weight to 72% by weight and more preferably 56% by weight to 64% by weight. The concentration of the binder resin in the varnish is preferably 10.3% by weight to 15.4% by weight and more preferably 12.0% by weight to 13.7% by weight. By adjusting the concentration of the individual components in the specific ranges respectively, a filler-containing resin layer having a uniform thickness and a smooth surface can be provided from the foregoing viewpoint.

When epoxy resin is used as the binder resin, it is preferable to add a dispersant in the coating liquid in a proportion of 1.7% by weight to 2.3% by weight. This is because the viscosity of the coating liquid remarkably decreases by adding a dispersant as apparent in line (b) in FIG. 4. Then, the concentrations of both the total solid content and insulating filler in the coating liquid can be adjusted higher and the concentration of the binder resin in the varnish can be adjusted higher as compared to polyimide resin. In other words, even when the concentration of the total solid content of the coating liquid is adjusted high, adjustment of the viscosity of the coating liquid to be 300 mPa·s or less is comparatively easy. So, in the case where epoxy resin is used as the binder resin, it is easier to provide a filler-containing resin layer having a smooth surface as compared to the case where polyimide resin is used.

Note that, although polyimide resin and epoxy resin are exemplified as the binder resin in the descriptions above and the preferable ranges of the concentrations in the individual binder resins are described above, the binder resin according to the present invention is not limited to these resins, i.e. the above listed various resins can be used. When other resins are used, it is preferable to appropriately prepare a varnish and a coating liquid each having a suitable concentration from the various viewpoints described above, in consideration of the factors including the type of the binder resin, the presence or absence of appropriate dispersant and the dispersion property of insulating filler in the varnish.

Dispersing Time: Next, the dispersing time on insulating filler will be described. As described above, by homogeneously dispersing insulating filler, the viscosity of the coating liquid is adjusted lower than the viscosity of the varnish. As apparent in FIG. 4, the dispersing time is preferably 20 minutes or more from the viewpoint of making the viscosity of the coating liquid lower. This is because by adjusting the dispersing time on insulating filler to be 20 minutes or more, the viscosity of the coating liquid after the homogeneous dispersion remarkably decreases as compared to the viscosity of the coating liquid before the homogeneous dispersion.

As apparent in FIG. 4, further extension of the dispersing time does not result a big change in the viscosity of the coating liquid. However, even the difference between the viscosities of the coating liquids with an extended dispersing time and a short dispersing time is not large, the longer the dispersing time on insulating filler is better. This is because by extending the dispersing time on insulating filler, insulating filler in the agglomerating state will be deagglomerated and insulating filler will disperse more homogeneously in the coating solution in a state of being finer particles, and then the filler-containing resin layer having a higher gloss at the surface and a smooth surface is provided. The time required for homogenous dispersion of insulating filler is different depending on the factors such as the particle size of insulating filler, the wettability of insulating filler to the coating solution and the type of the resin used as the binder resin. So, the preferable dispersing time is hardly specified in unqualified manner. However, at least it can be said that the smaller the particle size of insulating filler, the longer the dispersing time is preferable, and the lower the degree in decreasing of the viscosity of the coating liquid caused by the dispersion of insulating filler, the longer the dispersing time is preferable. In practice, polyimide resin gives a lower degree in decreasing of the viscosity of the coating liquid caused by the dispersion of insulating filler as compared to epoxy resin. So, when polyimide resin is used as the binder resin, the dispersion state of insulating filler is made more homogeneous by longer dispersing time on insulating filler.

Figure 5:
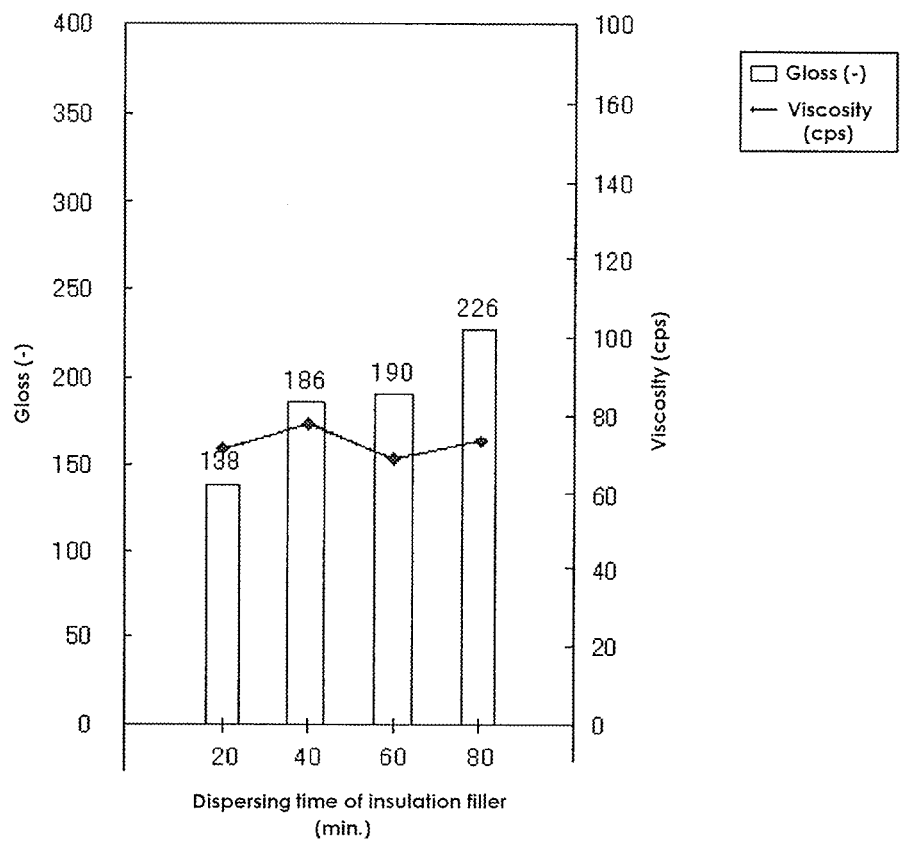
FIG. 5 is a graph demonstrating the relationship between the dispersing time on insulating filler and the gloss at the surface of the filler-containing resin layer. The coating liquid used in FIG. 5 is the same as the coating liquid prepared in Example 1.

For example, FIG. 5 shows a graph demonstrating relation between the viscosity of the coating liquid as a function of the dispersing time on insulating filler and the gloss at the surface of the finished filler-containing resin layer. Noted that the coating liquid used in FIG. 5 is the same as the coating liquid shown in FIG. 3. As apparent in FIG. 5, the longer the dispersing time on insulating filler, the gloss at the surface of the finished filler-containing resin layer is improved, and a filler-containing resin layer having a smoother surface is provided. Also, as apparent in FIGS. 3 and 4 for example, the viscosity of the coating liquid does not decrease with the increase of the dispersing time on insulating filler, but the viscosity of the coating liquid changes by the dispersion state of insulating filler. As apparent in FIG. 5, when the coating liquid having a dispersing time of 60 minutes and a coating liquid having a dispersing time of 80 minutes are compared, although the viscosity of the coating liquid with a dispersing time of 60 minutes shows a lower viscosity, the gloss at the surface of the filler-containing resin layer provided by using a coating liquid with a dispersing time of 60 minutes is lower than the gloss at the surface of the filler-containing resin layer provided by using a coating liquid with a dispersing time of 80 minutes. In this way, even when the viscosity of the coating liquid increases by extending the dispersing time, a filler-containing resin layer having a smoother surface is formed by sufficiently deagglomerating insulating filler in the agglomerating state to homogeneously disperse insulating filler close to primary particles in a coating solution. For example, in the case where an inorganic oxide particle in the specific particle size range is used as insulating filler, and when polyimide resin is used as the binder resin and insulating filler (BST) having an average particle size ($D_{IA}$) of about 68 nm is used, the preferable time for dispersing insulating filler is 60 minutes or more and more preferably 80 minutes or more, in consideration of the results shown in FIG. 5, from the viewpoint of providing a filler-containing resin layer having a gloss at the surface of 200 or more and having a smooth surface.

Disperser: For dispersing insulating filler, various dispersers such as a media disperser, a high speed shearing disperser and a high pressure disperser can be used. As a media disperser, Picomill described above, PCM-LR manufactured by Asada Iron Works Co., Ltd. can be used. Further, the Super Apex Mill manufactured by Kotobuki Industries Co., Ltd. and the Star Mill Nano Getter, a bead mill manufactured by Ashizawa Finetech Ltd. can be used also. From the viewpoint to achieve homogenous dispersion of insulating filler, it is preferable to use fine media beads of 0.3 mm to 0.03 mm in diameter as the dispersion media. The reason why fine media is used will be described. As described above, the longer dispersing time on insulating filler is preferable. However, just an extension of the dispersing time on insulating filler causes a problem of "over dispersion" involving the crystallinity deterioration or the reagglomeration in insulating filler. So, in the present invention, the energy transfer to each of insulating filler particles in dispersing is made smaller by using media of finer bead diameter to prevent the over dispersion of insulating filler. As a result, even with the longer dispersing time, the over dispersion of insulating filler is prevented, and then, dispersion of insulating filler in the coating solution can be made more homogenous.

Next, as a high speed shearing disperser, T. K. FILMICS manufactured by PRIMIX Corp. can be used. As a high pressure disperser, the Nanomizer manufactured by Yoshida Kikai Co., Ltd. can be used. Even when no media are used, when such a high speed shearing machine or such a high pressure disperser is used, insulating filler close to a primary particle in the coating solution is homogenously dispersed while the secondary particles of insulating filler are being deagglomerated gradually from the outer peripheries in such a manner that insulating filler in the secondary agglomeration state is "loosened." with prevention of the over dispersion.

2-2 Coating Step

Next, the coating step will be described. The coating step is a step of forming a coated film by applying the coating liquid prepared in the coating liquid preparation step on the smooth surface of the metal foil.

Metal Foil: The metal foil used in the present step has a smooth surface in which a gloss at the surface exceeds 400 and surface roughness (Ra) measured by an atomic force microscope in a measurement area of 5 μm×5 μm is 10 nm or less. Note that, the description on the metal foil will be omitted because the same metal foil as described above is used as the metal foil. However, it is preferable to use copper foil from the same reasons as described above. In this regard, as the same reasons described above are the grounds for the use of copper foil, the description on the reasons will be omitted also.

Coating Method: When the coating liquid is applied on the smooth surface of the metal foil, well known methods can be employed. For example, the coating liquid is applied on the smooth surface of the metal foil by using coaters including a gravure coater, a reverse gravure coater, a reverse kiss gravure coater, a die coater, a bar coater, a comma coater, a blade coater, a lip coater, a rod coater, a squeeze coater, a reverse roll coater and a transfer roll coater. In particular, it is preferable to use coaters suitable for forming such a thin coated film including a gravure coater, a reverse gravure coater and a reverse kiss gravure coater in the present invention from the viewpoint to form thin and uniform coated film by applying a coating liquid; and in particular, it is more preferable to use a reverse kiss gravure coater.

2-3 Drying Step

Next, drying step will be described. The drying step is a step for removing the volatile component (the solvent) in the coated film; i.e. drying of the coated film formed on the smooth surface of the metal foil after finishing the coating step. In the present invention, the filler-containing resin layer having a smooth surface is obtained with excellent reproducibility and with excellent yield by adjusting the viscosity of the coating liquid at coating to be an appropriate value through making the concentration of resin solid content concentration to be as high as possible, and controlling the rate of removing the volatile component in the coated film in the drying step (hereinafter, referred to as the "drying rate") as follows.

Drying Rate: In the present invention, the volatile component in the coated film is evaporated at a rate of 0.001 mg/min·cm$^2$ to 2 mg/min·cm$^2$ in the drying step. In other words, it is preferable to control the drying conditions to evaporate the volatile component in the coated film at a rate of 0.001 mg/min to 2 mg/min per 1 cm$^2$ of the metal foil. It is also preferable to slowly evaporate the volatile component in the coated film at the rate above while keeping the constant drying rate in the drying step. In the process of drying the coated film, the coated liquid self-fluidizes to make the surface to be horizontal. In the present invention, as the viscosity of the coating liquid is high, the flow of the coated liquid is slow, and it requires time until the surface of the coated film be horizontal. In other words, a so-called leveling time is required. So, in the present invention, a filler-containing resin layer having uniform thickness and smooth surface is formed by slowly evaporating the volatile component while keeping the leveling time in a manner not to inhibit self-fluidization of the coated liquid. Although it is general to appropriately adjust the drying rate at a suitable value depending on the volatility of the volatile component and the viscosity of the coating liquid; the diligent study made by the present inventor derived that gloss and the surface roughness at the surface of the filler-containing resin layer finished after the heat treatment step described later satisfies specific ranges described above respectively when the coated film is dried under the conditions to adjust the drying rate in the specific range described above. When the concentration of the total solid content in the coating liquid is adjusted in the specific range and the concentration of insulating filler in the coating liquid is adjusted high as described above, simply drying results insufficient leveling time and it is hard to obtain the filler-containing resin layer according to the present invention. Again, it is realized to obtain an extremely smooth filler-containing resin layer with excellent reproducibility by drying the coated film at the drying rate described above derived by the diligent study made by the present inventor.

Note that, more preferable upper limit of the drying rate is 1 mg/min·cm$^2$ or less. By removing the volatile component in the coated film at a rate of 1 mg/min·cm$^2$ or less, even when the viscosity of the coating liquid is adjusted high, the self-flow of the coated liquid is not inhibited and the leveling time is assured, and thus a filler-containing resin layer having a smoother surface is provided with excellent reproducibility.

In the present invention, the drying rate is determined as follows. First, a sufficient amount of the coating liquid is poured into a vessel having a flat bottom. Then, sum weight of the coating liquid and the vessel is measured. Next, the sum weight of the coating liquid and the vessel after passing a predetermined period of time from the start of the drying in a sealed space is measured. Then, the amount of the volatile component evaporated over a period of time is determined from the difference of the coating liquid weight in the vessel before and after passing the predetermined time after start of the drying. By dividing the amount of the evaporated volatile component by the bottom area of the vessel and the predetermined time, the drying rate is determined. In the present invention, the drying rate is calculated by setting the predetermined time to be 10 minutes. In the present invention, the drying conditions include the drying temperature, the humidity of the atmosphere and the pressure of the atmosphere. The drying rate is calculated for each of the different drying conditions with different drying conditions, and the correlation between the drying conditions and the drying rate is determined in advance. In the actual drying step, the drying of the coated film is carried out under the drying conditions satisfying the drying rate according to the thus determined relation between the drying rate and the drying conditions.

When the drying rate of the coated film is less than 0.001 mg/min·cm$^2$, the evaporation of the volatile component is too slow, and such a rate leads to poor industrial productivity. Also, when the drying rate of the coated film is less than 0.001 mg/min·cm$^2$, the coated film may absorb moisture due to the humidity in the atmosphere. When the coated film absorbs moisture, the absorbed moisture will evaporate in the drying step and irregularities tend to occur on the surface of the coated film. As a result, formation of a filler-containing resin layer having the gloss and the surface roughness (Ra) at the surface satisfying the specific ranges is made difficult.

On the contrary, when the drying rate of the coated film in the drying step exceeds 2 mg/min·cm$^2$, irregularities tend to occur on the surface of the coated film because the leveling time is insufficient. As a result, formation of a filler-containing resin layer having a smooth surface in which the gloss and the surface roughness (Ra) at the surface satisfy the specific ranges is made difficult. In other words, to form the filler-containing resin layer having the gloss and the surface roughness (Ra) at the surface satisfying the specific ranges, prevention of both the moisture absorption in the coated film and slow evaporation of the volatile component is important.

Humidity in Atmosphere: As described above, when the coated film absorbs moisture, the drying rate will be out of the specific range, and it will make formation of a filler-containing resin layer having a smooth surface in which the gloss and the surface roughness (Ra) at the surface satisfy the specific ranges difficult. So, in the drying step, it is preferable to dry the coated film to satisfy the specific drying rate under the condition that the moisture absorption in the coated film is prevented. When the weight of the coated film increases before the start of the drying step by absorption of moisture, it will make formation of a filler-containing resin layer having a smooth surface difficult because of the same reasons as described above. In practice, when the coating liquid is prepared to make the layer thickness of the filler-containing resin layer 1 μm, the increase of the weight of the coated film after the formation of the coated film is preferably 5% or less and more preferably 4% or less of the weight of the solvent used in the preparation of the coating liquid. Of course, it is most preferable to inhibit the moisture absorption in the coated film. So, it is preferable to store the coated film in an atmosphere adjusted in humidity to be a relative humidity of 25% or less before the start of the drying step in order to prevent the moisture absorption in the coated film, for example. When a relative humidity of an atmosphere is 20% or less, the moisture absorption in the coated film is not detected. On the other hand, when relative humidity exceeds 25%, the moisture absorption in the coated film may occur depending on the temperature or the humidity in the atmosphere.

Figure 6:
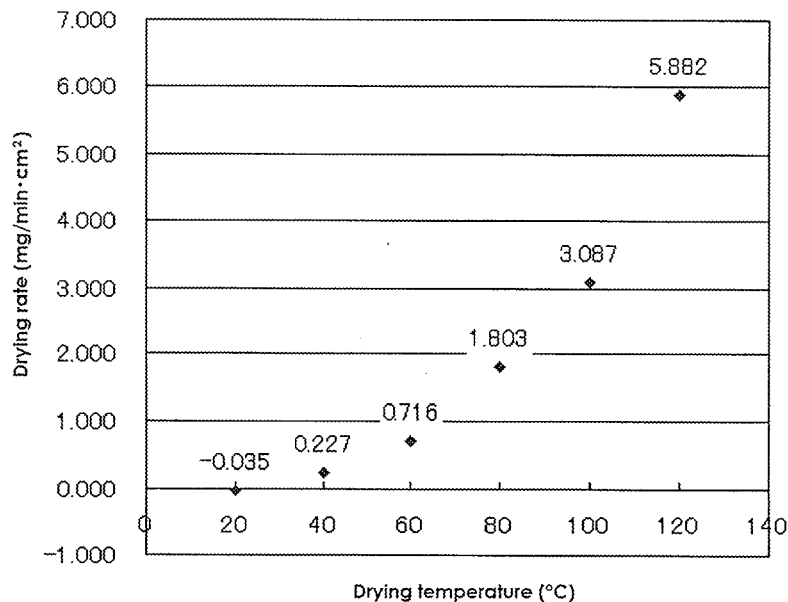
FIG. 6 is a graph demonstrating the relationship between the drying temperature and the drying rate. The drying rate in FIG. 6 was obtained by using the same coating liquid prepared in Example 1.

Drying Temperature: FIG. 6 demonstrates the relation between the drying temperature and the drying rate when the coated film is dried in a sealed space where relative humidity at 20° C. is adjusted 30% (absolute humidity: 0.0055 kg/kg) for reference. As apparent in FIG. 6, when the drying temperature is set at 20° C., the drying rate per unit area is −0.035 mg/min·cm$^2$ in the humidity-adjusted atmosphere. In other words, the increase of the weight of the coated film is detected. It is also confirmed that when the coated film is dried at an elevated drying temperature in the humidity-adjusted atmosphere, the drying rate per unit area increases with the elevation of the drying temperature, as a matter of course. When the drying temperature is 40° C., the drying rate is 0.227 mg/min·cm². Relative humidity in the atmosphere determined by calculation is 9.5%. When the drying temperature is further elevated to 60° C., the drying rate is 0.716 mg/min·cm². Relative humidity in the atmosphere determined by calculation is 3.5%. Next, the gloss at the surface and the surface roughness at the surface of the finished filler-containing resin layer when the drying temperature is set at 40° C. are almost same with those of the finished filler-containing resin layer when the drying temperature is set at 60° C. On the other hand, the finished filler-containing resin layer is a filler-containing resin layer having the gloss at the surface of 200 or more, and the surface roughness (Ra) measured by an atomic force microscope in a measurement area of 5 μm×5 μm of 25 nm or less when the drying temperature is set at 80° C. However, the filler-containing resin layer obtained with a drying temperature of 80° C. is lower in the gloss at the surface and the surface roughness is also rougher as compared to the filler-containing resin layers obtained by drying the coated films at 40° C. and 60° C. From these results, from the viewpoint of formation of a filler-containing resin layer further excellent in the gloss at the surface and small in the surface roughness with excellent reproducibility, it is preferable to set the upper limit of the drying rate to be 1 mg/min·cm² or less as described above.

Next, the present invention will be specifically described with reference to Examples and Comparative Examples. However, the present invention is not limited to following Example.

Example 1

<Manufacturing of Metal Foil Provided with Filler-Containing Resin Layer>

Coating Liquid Preparation Step: In Example 1, the coating liquid was prepared by using a commercially available raw varnish. The mixing amounts of the components of the coating liquid used in the preparation of the coating liquid are shown in Table 1. In Example 1, as a commercially available raw varnish was used in the preparation of the coating liquid, concentration of the resin solid content and viscosity of the varnish were adjusted by using an additional solvent for the purpose of adjusting the resin concentration of solid content in the varnish.

Binder Resin: In Example 1, polyimide resin was used as the binder resin. As apparent in Table 1, 300 g of U-Varnish-S manufactured by Ube Industries, Ltd. was used as a raw varnish. The raw varnish is a 20% by weight polyamic acid solution prepared by dissolving polyamic acid, a precursor of polyimide resin, in N-methyl-2-pyrrolidone. Polyamic acid is obtained by using a tetracarboxylic acid dianhydride and a diamine as the raw materials. The polyamic acid solution used was a polyamic acid obtained from biphenyltetracarboxylic acid dianhydride and paraphenylenediamine. When polyamic acid is heated, dehydration reaction is promoted and polyamic acid causes condensation polymerization to form polyimide resin. The weight of the obtained polyimide resin is reduced by 10% by weight from the weight of polyamic acid. So, the concentration of resin solid content in the raw varnish is 18% by weight. Thus, the resin solid content contained in 300 g of the raw varnish is 54 g and the amount of the solvent is 240 g.

Solvent: In Example 1, N-methyl-2-pyrrolidone, the same solvent contained in the raw varnish was used as a solvent. As described above, about 240 g of N-methyl-2-pyrrolidone was contained in the raw varnish. So, in the coating liquid, 690 g of the solvent was used.

Insulating filler: In Example 1, 126 g of barium strontium titanate powder was used as insulating filler. In the barium strontium titanate, the ratio of barium to strontium is 9. The density of the powder is 5.5 g/cm³ and the average secondary particle size ($D_{IA}$) of insulating filler was about 68 nm. It should be noted that, the average secondary particle size ($D_{IA}$) is a value determined according to a SEM image as described above. The SEM image of insulating filler is shown in FIG. 1.

TABLE 1

|  | Mixing amount | Solid Content amount | Solvent amount |
|---|---|---|---|
| U-Varnish-S (manufactured by Ube Industries, Ltd.) (Binder resin + solvent) | 300 g | 54 g | 240 g |
| N-Methyl-2-pyrrolidone (solvent) | 450 g | 0 g | 450 g |
| Barium strontium titanate (insulating filler) | 126 g | 126 g | 0 g |
| Sum | 826 g | 180 g | 690 g |

First, a varnish having a concentration of the resin solid content of 7.2% by weight was prepared by using the components of the coating liquid; diluting 300 g of the raw varnish with 450 g of the solvent. Then, the coating liquid used in Example 1 was prepared by mixing 126 g of the barium strontium titanate to the varnish followed by dispersing with the Picomill disperser using fine media having a bead diameter of 0.05 mm for 80 minutes. The weight concentration of insulating filler in the coating liquid is 15.3% by weight. The weight concentration of the total solid content as the sum content of insulating filler and the binder resin (resin solid content) in the coating liquid is 21.8% by weight. The mixing amounts of the individual components in the coating liquid were adjusted in such a way that insulating filler was included in a content of 70% by weight in relation to the sum weight of insulating filler and the resin solid content in the finished filler-containing resin layer obtained after heat treatment set at 100% by weight.

Coating Step: In the coating step, two sheets of copper foil each having a sheet area of 10 cm² and a thickness of 18 μm were used, and the coating liquid was applied on the smooth surface of the copper foil sheets by using a bar coater. In this case, the coating liquid was applied on the smooth surface of the copper foil to make thickness of the finished filler-containing resin layer 1 μm. The gloss and the surface roughness (Ra) at the smooth surface of the copper foil were 538 and 5.7 nm respectively.

Drying Step: After finishing the coating step, the coated film was dried and thus a filler-containing resin layer in a semi-cured state was formed on the smooth surface of the copper foil. In the drying step, the two sheets of copper foil provided with the coated film prepared in the coating step were dried under different conditions.

Sample 1: One sheet of copper foil provided with a coated film in the two sheets of the copper foil provided with a coated film was dried in the condition where the drying rate per unit area is 0.227 mg/min·cm². In this case, the practical drying conditions were such that the drying temperature was 40° C. and the pressure was normal pressure. Further, relative humidity was 12%. Under the specific drying conditions, drying of the coated film was carried out for 60 minutes. However, actually, the coated film had dried in about 30 minutes. The copper foil provided with a filler-containing resin layer finished under the drying conditions is referred to as Sample 1.

Sample 2: Another sheet of copper foil provided with a coated film was dried in the condition where drying rate per unit area is 0.002 mg/min·cm². In this case, the practical drying conditions were such that the drying temperature was 25° C., the atmosphere was a nitrogen-replaced atmosphere and the pressure was normal pressure. The case took 5 days for drying of the coated film. The copper foil provided with a filler-containing resin layer finished under the drying condition is referred to as Sample 2.

Comparative Example

Next, Comparative Example will be described. In Comparative Example, Comparative Sample 1 was prepared in the same manner as in Sample 1 except that the coated film was dried in the condition where the drying rate per unit area is 5.882 mg/min·cm². In this case, the actual drying conditions were such that the drying temperature was 120° C. and the pressure was normal pressure.

<Evaluations>

Figure 7:
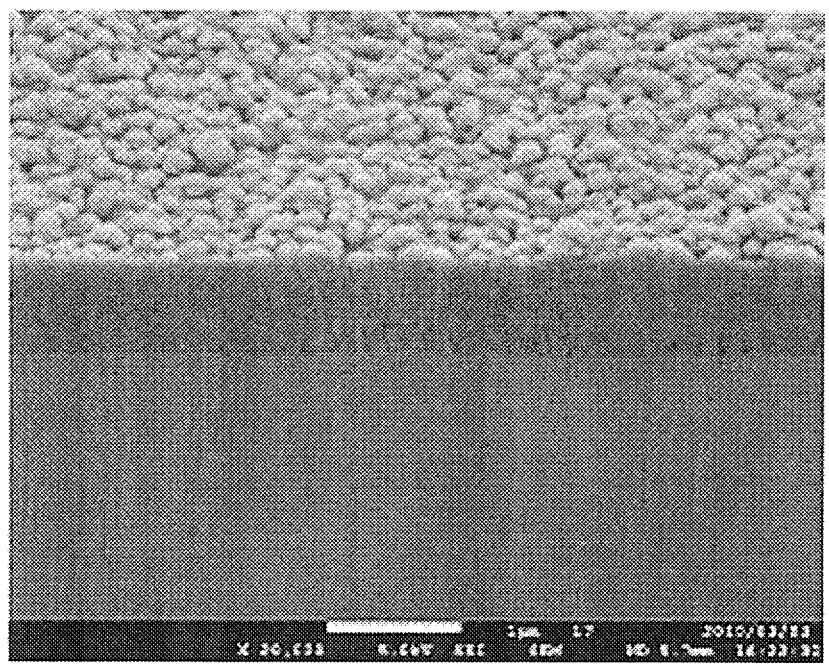
FIG. 7 is a SEM image showing the surface of the filler-containing resin layer of Sample 1 obtained in Example 1.
Figure 8:
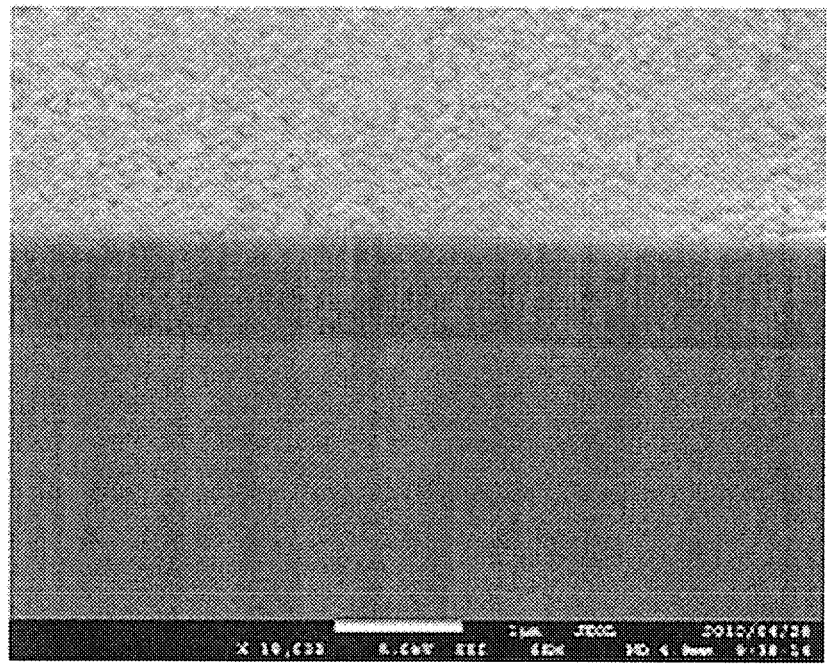
FIG. 8 is a SEM image showing the surface of the filler-containing resin layer of Sample 2 obtained in Example 1.
Figure 9:
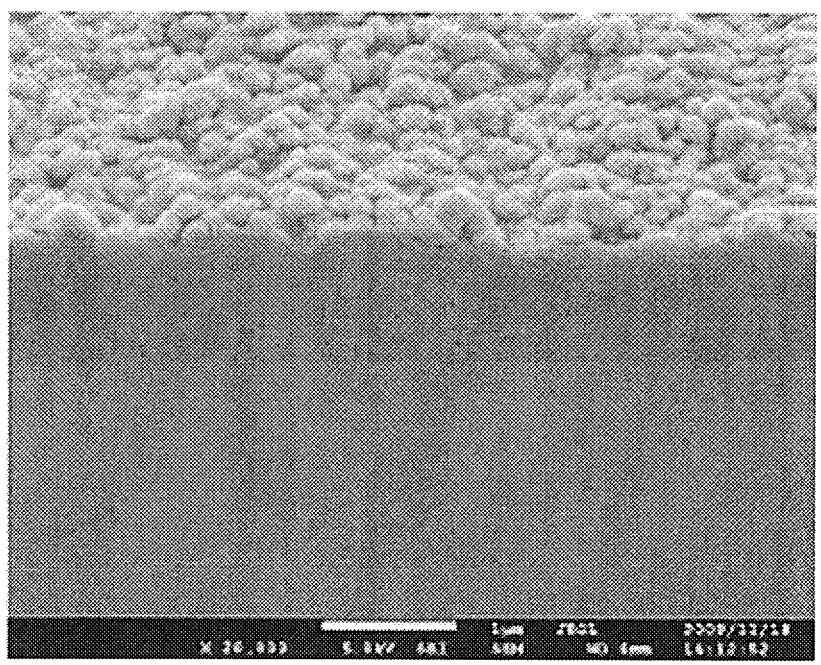
FIG. 9 is a SEM image showing the surface of the filler-containing resin layer of Comparative Sample 1 obtained in Comparative Example 1.

On Sample 1, Sample 2 and Comparative Sample 1 obtained in Example 1 and Comparative Example, the surface of the filler-containing resin layer was evaluated. FIGS. 7 to 9 are the SEM images showing the surfaces of the filler-containing resin layers of Sample 1, Sample 2 and Comparative Sample 1 respectively (magnification: 20,000 times). For taking these SEM images, a SEM (JSM-700IF) manufactured by JEOL Ltd. was used. As apparent in FIGS. 7 to 9, the surfaces of the filler-containing resin layers of Sample 1 and Sample 2 shown in FIGS. 7 and 8 respectively are smoother than the surface of the filler-containing resin layer of Comparative Sample 1 shown in FIG. 9. Also, it is apparent in comparison between Sample 1 and Sample 2 that the surface of the filler-containing resin layer of Sample 2 of which drying rate was remarkably slow is smoother than that of Sample 1.

Next, the gloss and the surface roughness (Ra) at the surface of the filler-containing resin layers of Sample 1, Sample 2 and Comparative Sample 1 were measured. The gloss is a value determined by the measurement with a gloss-meter VG-2000 manufactured by Nippon Denshoku Industries Co., Ltd., according to JIS Z 8741-1997. The surface roughness is a value obtained by measuring with the atomic force microscope NanoscopeV for Dimension Series manufactured by Nihon Veeco K.K., under the conditions, tapping mode without flattening correction. The results are shown in Table 2.

TABLE 2

|  | Drying rate (mg/min · cm²) | Gloss | Surface roughness (Ra) (nm) |
| --- | --- | --- | --- |
| Sample 1 | 0.227 | 260 | 25 |
| Sample 2 | 0.002 | 314 | 20 |
| Comparative Sample 1 | 5.882 | 150 | 33 |

As apparent in Table 2, the glosses at the surfaces of Sample 1 and Sample 2 were 260 and 314 respectively. In contrast, the gloss at the surface of Comparative Sample 1 was 150. Also apparent in FIG. 9, surface of Comparative Sample 1 was rougher as compared to surfaces of Sample 1 and Sample 2. As for the surface roughness (Ra), the surface roughness (Ra) of Sample 1 and Sample 2 were about 25 nm and 20 nm respectively, whereas the surface roughness (Ra) of Comparative Sample 1 was about 33 nm. As apparent in the results, even when the mixing amounts of the individual components included in the coating liquids and dispersing times are the same, the different drying conditions result different values in smoothness at the surfaces of the finished filler-containing resin layers.

As apparent in FIG. 5, even when the mixing amounts of the individual components included in the coating liquid are the same, the glosses at the surfaces of the finished filler-containing resin layers are different from each other by changing the dispersing time in the coating liquid preparation.

As apparent in the descriptions above, even when the mixing amounts of the individual components included in the coating liquid are adjusted as described above to adjust the mixing proportions of the individual components in the finished filler-containing resin layer, smoothness on the surface of the filler-containing resin layer changes depending on the dispersing time of the coating liquid and the drying conditions of the coated film. In other words, even when the contents of the binder resin and insulating filler included in the filler-containing resin layer are the same, difference in dispersing conditions or drying conditions in the production process will result difference in both gloss and the surface roughness (Ra) at the surface, i.e. it is difficult to obtain an insulating layer having a smooth surface with excellent reproducibility. So, it is confirmed that by strictly controlling the dispersing time of the coating liquid and the drying conditions of the coated film according to the present invention, the smoothness on the surface of the finished filler-containing resin layer can be made stable.

In the present invention, a filler-containing resin layer having a surface of which gloss is 200 or more and surface roughness (Ra) measured by an atomic force microscope in a measurement area of 5 µm×5 µm is 25 nm or less is obtained by adjusting the dispersing condition and the drying conditions. In this way, the filler-containing resin layer is provided in a wide area simply and with excellent reproducibility because additional step of smoothing the surface of the filler-containing resin layer and the smoothing device are dispensable.

Figure 10:
FIG. 10 is a SEM image showing the secondary agglomerating state of insulating filler having an average particle size ($D_{IA}$) of about 66 nm and the coefficient of variation (CV) of 45%.

The influence of the particle size distribution was also investigated. A reference sample was prepared in the same manner as in Sample 1 prepared in Example 1 except that insulating filler shown in FIG. 10 having an average particle size ($D_{IA}$) of about 66 nm and a coefficient of variation (CV) of 45% was used. No large difference was found in the viscosity or the like in the coating liquid preparation step; however, the gloss at the surface of the finished filler-containing resin layer using a insulating filler having a coefficient of variation (CV) of 45% was about 20% lower than that of Sample 1 using a insulating filler having a coefficient of variation (CV) of 38%. It means that when insulating filler having a lower coefficient of variation (CV), i.e. a smaller particle size deviation is used, a filler-containing resin layer having a smoother surface can be provided with excellent reproducibility.

Figure 11:
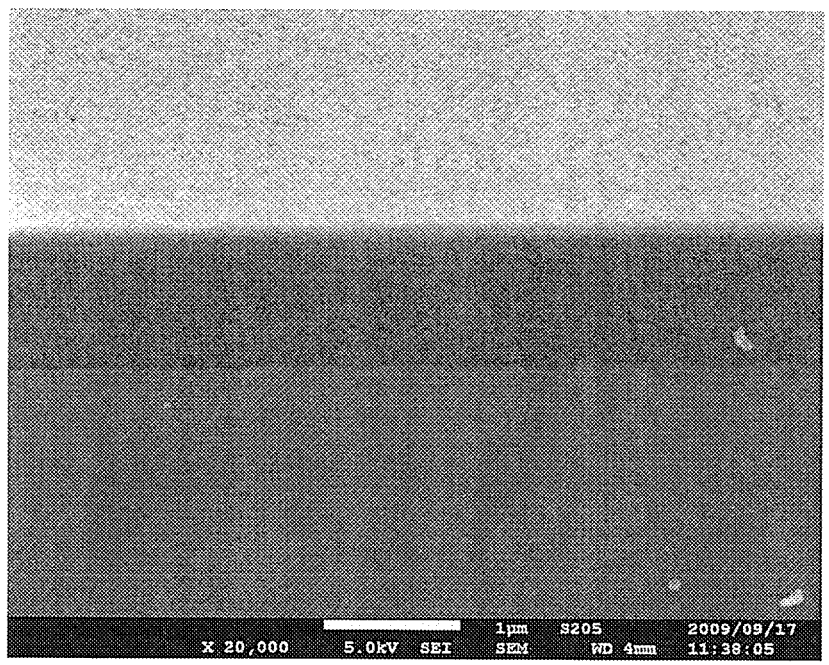
FIG. 11 is a SEM image showing the surface of the filler-containing resin layer employing epoxy resin as a binder resin.

Further, FIG. 11 shows the surface SEM image of a filler-containing resin layer prepared by using epoxy resin as the binder resin. The SEM image in FIG. 11 was imaged in the same manner as in the case of Sample 1. In the copper foil with a filler-containing resin layer shown in FIG. 11, the coating liquid was prepared to adjust the concentration of the total solid content in the coating liquid to be 80% by weight by mixing insulating filler to the varnish having a concentration of the binder resin of 13.7% by weight, and by adding a dispersant (BYK-111, manufactured by BYK-Chemie GmbH) in a concentration of 2.3% by weight. In this case, the viscosity of the coating liquid was 63.6 mPa·s. On the contrary, the viscosity of the coating liquid prepared in Example 1 was 95.8 mPa·s. In this way, when epoxy resin is used as the binder resin, the viscosity of the coating liquid decreases to a large extent by adding a dispersant as apparent in FIG. 4. So, the concentration of the total solid content in the coating liquid can be adjusted higher as compared to the case where polyimide resin is used as the binder resin. So, when epoxy resin is used, a filler-containing resin layer having a smooth surface can be formed with excellent reproducibility and comparatively easy as compared to when polyimide resin is used.

INDUSTRIAL APPLICABILITY

The metal foil provided with a filler-containing resin layer according to the present invention is suitably used as an electronic circuit-forming material for forming various electric circuits on printed wiring boards, semiconductor mounting substrates or the like, as an electronic device-forming material for forming various electronic devices, or the like. In particular, the filler-containing resin layer is thin and excellent in smooth surface, electronic circuits or electronic devices excellent in reliability can be formed.

The invention claimed is:

1. A metal foil provided with a filler-containing resin layer, the filler-containing resin layer having a side facing the metal foil and an opposing side not facing the metal foil, wherein a metal foil and the filler-containing resin layer composed of insulating filler and a binder resin are directly stacked against each other; wherein:

the metal foil has smooth surface of which gloss exceeds 400 and surface roughness (Ra) measured by an atomic force microscope in a measurement area of 5 m×5 m is 10 nm or less; wherein the insulating filler is an inorganic oxide particle having an average particle size ($D_{TA}$) of 5 nm to 150 nm and the coefficient of variation (CV) in the particle size distribution of insulating filler represented by the following formula is 40% or less;

CV (%)=[standard deviation (S.D.)]/[average particle size ($D_{IA}$)]×100 (formula);

and the filler-containing resin layer applied on the smooth surface has a thickness of 0.1 m to 3.0 m, the gloss at the surface of the opposing side of the filler-containing resin layer is 200 or more, and the surface roughness (Ra) measured by an atomic force microscope in a measurement area of 5 m×5 m on the filler-containing resin layer is 25 nm or less.

2. The metal foil provided with a filler-containing resin layer according to claim 1, wherein insulating filler is a dielectric particle.

3. The metal foil provided with a filler-containing resin layer according to claim 1, wherein the filler-containing resin layer contains insulating filler from 50% by weight to 90% by weight in relation to the sum amount of insulating filler and the binder resin set at 100% by weight.

4. The metal foil provided with a filler-containing resin layer according to claim 1, wherein the metal foil is copper foil.

5. A method for manufacturing the metal foil provided with a filler-containing resin layer according to claim 1, comprising:

a coating liquid preparation step for preparation of a coating liquid including insulating filler dispersed in a varnish including a binder resin composition and a solvent;

a coating step for forming a coated film by applying the coating liquid prepared in the coating liquid preparation step on a smooth surface of the metal foil;

a drying step for removing a volatile component in the coated film after finishing the coating step; and a heat treatment step for finishing the filler-containing resin layer by performing a heat treatment on the coated film after finishing the drying step.

6. The method for manufacturing the metal foil provided with a filler-containing resin layer according to claim 5, wherein the coating liquid contains insulating filler in the amount from 50% by weight to 90% by weight in relation to the total solid content as the sum amount of insulating filler included in the coating liquid and the binder resin obtained from the binder resin composition set at 100% by weight.

7. The method for manufacturing the metal foil provided with a filler-containing resin layer according to claim 5, wherein the viscosity of the coating liquid is 300 mPa·s or less.

8. The metal foil provided with a filler-containing resin layer according to claim 5, wherein insulating filler is an inorganic oxide particle having an average particle size ($D_{IA}$) of 5 nm to 150 nm.

9. The metal foil provided with a filler-containing resin layer according to claim 8, wherein the coefficient of variation (CV) of the particle size distribution of insulating filler represented by the following formula is 40% or less:

CV (%)=[standard deviation (S.D.)]/[average particle size ($D_{IA}$)]×100 (formula).

10. The method for manufacturing the metal foil provided with a filler-containing resin layer according to claim 5, wherein the volatile component in the coated film is evaporated at a rate of 0.001 mg/min·cm² to 2 mg/min·cm² in the drying step.

* * * * *